(12) United States Patent
Liao

(10) Patent No.: US 11,304,349 B2
(45) Date of Patent: Apr. 12, 2022

(54) METHOD FOR REPAIRING A LIGHT-EMITTING UNIT, METHOD FOR REPAIRING A SEMICONDUCTOR CHIP, AND METHOD FOR MANUFACTURING AN LED MODULE

(71) Applicant: ASTI GLOBAL INC., TAIWAN, Changhua County (TW)

(72) Inventor: Chien-Shou Liao, New Taipei (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 225 days.

(21) Appl. No.: 16/535,211

(22) Filed: Aug. 8, 2019

(65) Prior Publication Data
US 2020/0221616 A1    Jul. 9, 2020

(30) Foreign Application Priority Data
Jan. 4, 2019   (TW) ................................ 108100396

(51) Int. Cl.
*H05K 13/04*    (2006.01)
*H05K 1/18*     (2006.01)
*H05K 13/08*    (2006.01)

(52) U.S. Cl.
CPC ......... *H05K 13/0486* (2013.01); *H05K 1/181* (2013.01); *H05K 13/0409* (2018.08); *H05K 13/0469* (2013.01); *H05K 13/0812* (2018.08); *H05K 13/0815* (2018.08); *H05K 2201/10106* (2013.01)

(58) Field of Classification Search
CPC .......... H05K 13/0409; H05K 13/0469; H05K 13/0486; H05K 13/0812; H05K 13/0815; H05K 1/181
See application file for complete search history.

(56) References Cited

U.S. PATENT DOCUMENTS

| 10,388,826 B2 * | 8/2019 | Liao ..................... H01L 33/0095 |
| 10,636,937 B2 * | 4/2020 | Liao ..................... H01L 25/0753 |
| 2005/0095733 A1 * | 5/2005 | Priewasser ............. H01L 24/27 438/17 |

(Continued)

FOREIGN PATENT DOCUMENTS

| CN | 101881379 A | 11/2010 |
| CN | 105518888 A | 4/2016 |

(Continued)

*Primary Examiner* — Minh N Trinh
(74) *Attorney, Agent, or Firm* — JCIPRNET

(57) ABSTRACT

A method for repairing a semiconductor chip and a device for repairing a semiconductor chip is provided, and the method for repairing a semiconductor chip includes: providing a plurality of light-emitting units, and at least one of the light-emitting units being a damaged light-emitting unit; next, removing the damaged light-emitting unit to form an unoccupied position; then, using a pick and place module to obtain a good light-emitting unit from a carrier board; then, a volatile adhesive material is formed on the bottom of the good light-emitting unit; next, the volatile adhesive material is used to adhere the good light-emitting unit to the unoccupied position; finally, the good light-emitting unit is heated so that the good light-emitting unit is fixed onto the unoccupied position.

9 Claims, 13 Drawing Sheets

(56) References Cited

U.S. PATENT DOCUMENTS

| | | | | |
|---|---|---|---|---|
| 2008/0318055 | A1* | 12/2008 | Fillion | H05K 1/185 |
| | | | | 428/412 |
| 2009/0230568 | A1* | 9/2009 | Yasuda | C09J 7/10 |
| | | | | 257/787 |
| 2012/0315710 | A1* | 12/2012 | Hozawa | H01L 24/96 |
| | | | | 438/5 |
| 2018/0309019 | A1* | 10/2018 | Liao | H01L 33/0095 |
| 2020/0221616 | A1* | 7/2020 | Liao | H05K 3/341 |

FOREIGN PATENT DOCUMENTS

| | | |
|---|---|---|
| CN | 107749438 A | 3/2018 |
| CN | 108735872 A | 11/2018 |
| CN | 109121318 A | 1/2019 |

* cited by examiner

METHOD FOR REPAIRING A LIGHT-EMITTING UNIT, METHOD FOR REPAIRING A SEMICONDUCTOR CHIP, AND METHOD FOR MANUFACTURING AN LED MODULE

CROSS-REFERENCE TO RELATED PATENT APPLICATION

This application claims the benefit of priority to Taiwan Patent Application No. 108100396, filed on Jan. 4, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a repair method and a repair device, and more particularly to a method for repairing a semiconductor chip and a device for repairing a semiconductor chip.

BACKGROUND OF THE DISCLOSURE

Light-emitting diodes (LED) are widely used nowadays due to their excellent light quality and high luminous efficiency. Generally, in order for a display device using a light-emitting diode as a light-emitting element to have better color performance, a conventional display device adopts a combination of red, green, and blue light-emitting diode chips to form a full color light-emitting diode display device. The full-color light-emitting diode display device can respectively emit three colors of red, green and blue light through three kinds of red, green and blue light-emitting diode chips, so that a full-color light is formed to display relevant information after the mixing of light. However, in the related art, when the LED chip fixed onto the circuit substrate is damaged, the damaged LED chip can no longer be repaired.

SUMMARY OF THE DISCLOSURE

In response to the above-referenced technical inadequacies, the present disclosure provides a method for repairing a semiconductor chip and a device for repairing a semiconductor chip.

In one aspect, the present disclosure provides a method for repairing a semiconductor chip, including: providing a plurality of light-emitting units, with at least one of the plurality of light-emitting units being a damaged light-emitting unit; then, removing the damaged light-emitting unit to form an unoccupied position; next, using a pick and place module to obtain a good (i.e., intact) light-emitting unit from a carrier board; next, forming a volatile adhesive material on the bottom of the good light-emitting unit; and then using the volatile adhesive material to adhere the good light-emitting unit to the unoccupied position; finally, heating the good light-emitting unit so that the good light-emitting unit is fixed at the unoccupied position.

In one aspect, the present disclosure provides a method for repairing a semiconductor chip, including: providing an LED module, the LED module including a circuit substrate and a plurality of light-emitting units disposed on the circuit substrate and electrically connected to the circuit substrate, with at least one of the plurality of light-emitting units being a damaged light-emitting unit; then, directing a laser source generated to the damaged light-emitting unit by a laser generating module to reduce the bonding force between the damaged light-emitting unit and the circuit substrate; next, removing the damaged light-emitting unit from the circuit substrate by a pick and place module to form an unoccupied space; then, placing a good light-emitting unit into the unoccupied space by the pick and place module; and then, electrically connecting the good light-emitting unit to the circuit substrate.

In one aspect, the present disclosure provides a device for repairing a semiconductor chip. The device for repairing a semiconductor chip is applied to an LED module. The LED module includes a circuit substrate and a plurality of light-emitting units disposed on the circuit substrate and electrically connected to the circuit substrate, and at least one of the light-emitting units is a damaged light-emitting unit. The device for repairing a semiconductor chip includes: a laser generating module and a pick and place module. The laser generating module is adjacent to the circuit substrate and disposed under the circuit substrate for generating a laser source. The pick and place module is adjacent to the light-emitting unit and disposed above the light-emitting unit. The laser source generated by the laser generating module is directed to the damaged light-emitting unit to reduce the bonding force between the damaged light-emitting unit and the circuit substrate. The pick and place module removes the damaged light-emitting unit from the circuit substrate to form an unoccupied space, and the pick and place module places a good light-emitting unit into the unoccupied space.

One of the beneficial effects of the present disclosure is that the method for repairing a semiconductor chip has the technical features of "using a pick and place module to obtain a good light-emitting unit from a carrier board," "forming a volatile adhesive material on the bottom of the good light-emitting unit," "using the volatile adhesive material to adhere the good light-emitting unit to the unoccupied position" and "heating the good light-emitting unit, so that the good light-emitting unit is fixed onto the unoccupied position" so that the damaged light-emitting unit can be replaced by the good light-emitting unit to achieve the effect of repairing.

Another beneficial effect of the present disclosure is that the method for repairing a semiconductor chip has the technical features of "directing a laser source generated by a laser generating module to the damaged light-emitting unit to reduce the bonding force between the damaged light-emitting unit and the circuit substrate," "placing a good light-emitting unit into the unoccupied space by the pick and place module," and "electrically connecting the good light-emitting unit to the circuit substrate" so that the damaged light-emitting unit can be replaced by the good light-emitting unit to achieve the effect of repairing.

Still another beneficial effect of the present disclosure is that the device for repairing a semiconductor chip has the technical features of "the laser generating module being adjacent to the circuit substrate and disposed under the circuit substrate for generating a laser source" and "the pick and place module being adjacent to the light-emitting unit and disposed above the light-emitting unit" so that the laser source generated by the laser generating module is directed to the damaged light-emitting unit to reduce the bonding force between the damaged light-emitting unit and the circuit substrate, and to remove the damaged light-emitting unit from the circuit substrate by the pick and place module to form an unoccupied space. Thereby, since the pick and place module places a good light-emitting unit into the unoccupied space, the damaged light-emitting unit can be replaced by the good light-emitting unit to achieve the effect of repairing.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
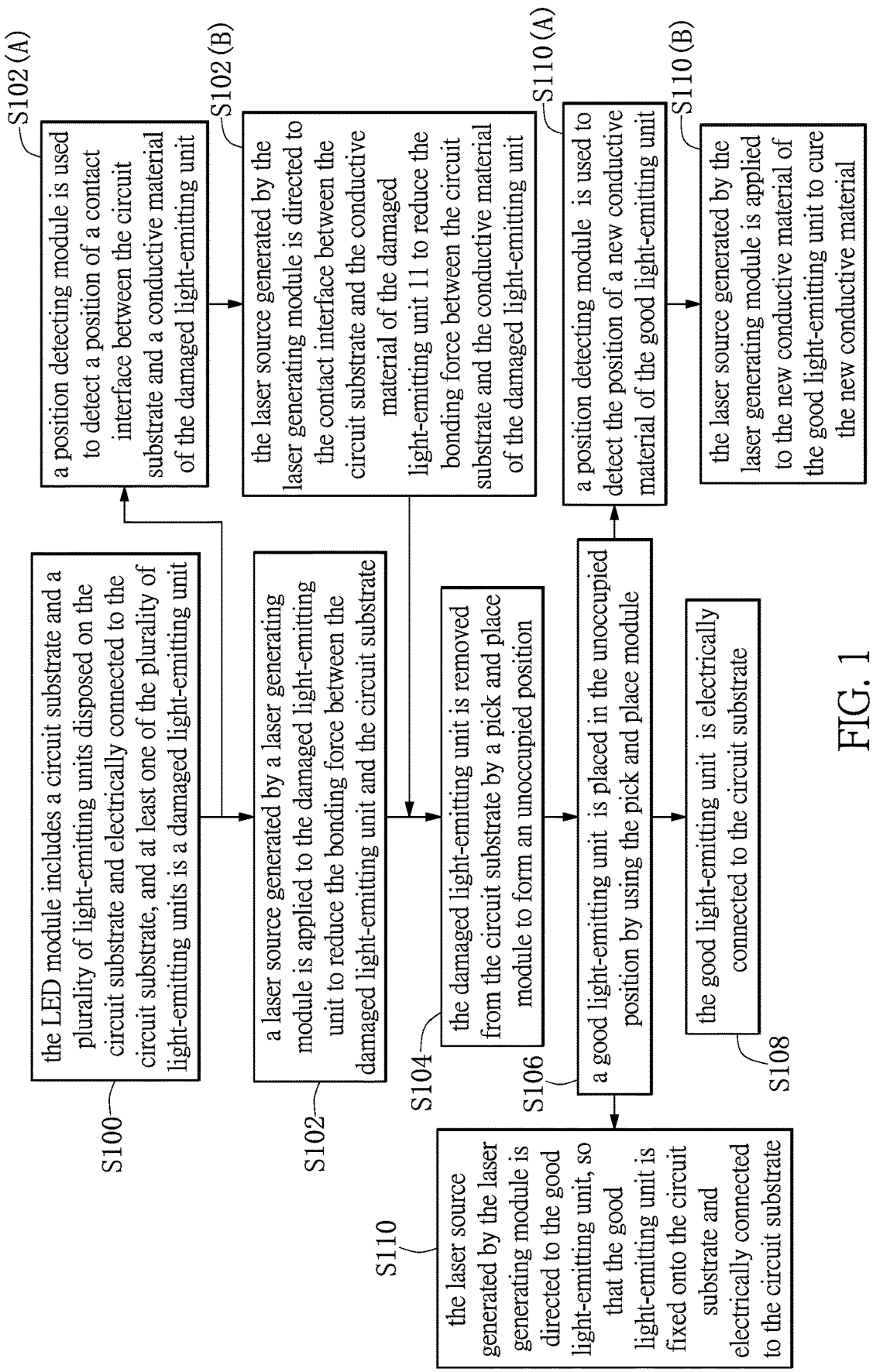
FIG. 1 is a flow chart of a method for repairing a semiconductor chip according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
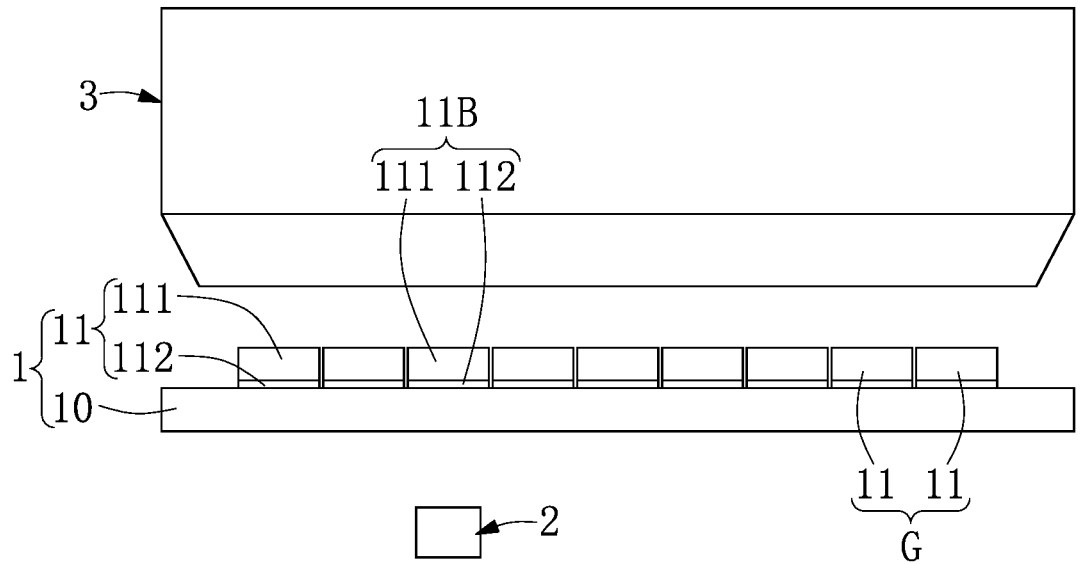
FIG. 2 is a schematic view of a step S100 of the method for repairing a semiconductor chip according to the first embodiment of the present disclosure.

Referring to FIG. 1 to FIG. 6, a first embodiment of the present disclosure provides a method for repairing a semiconductor chip, including the following steps:

First, as shown in FIG. 1 and FIG. 2, an LED module 1 is provided. The LED module 1 includes a circuit substrate 10 and a plurality of light-emitting units 11 disposed on the circuit substrate 10 and electrically connected to the circuit substrate 10, and at least one of the plurality of light-emitting units 11 is a damaged light-emitting unit 11B (step S100). In other words, the LED module 1 includes a circuit substrate 10 and a light-emitting group G disposed on the circuit substrate 10 and electrically connected to the circuit substrate 10, and the light-emitting group G includes a plurality of light-emitting units 11.

For example, each light-emitting unit 11 includes an LED chip 111 and a conductive material 112 disposed between the bottom end of the LED chip 111 and the circuit substrate 10. In addition, the LED chip 111 may be a gallium nitride LED chip (GaN LED). In addition, the conductive material 112 may be an anisotropic conductive film (ACF), an anisotropic conductive paste (ACP), or any kind of conductive material. It should be noted that the damaged light-emitting unit 11B may result in a situation where the LED chip 111 is damaged and cannot provide a light source, or a situation where the conductive material 112 is incapable of conducting electricity so as to cause electrical failure.

Figure 3:
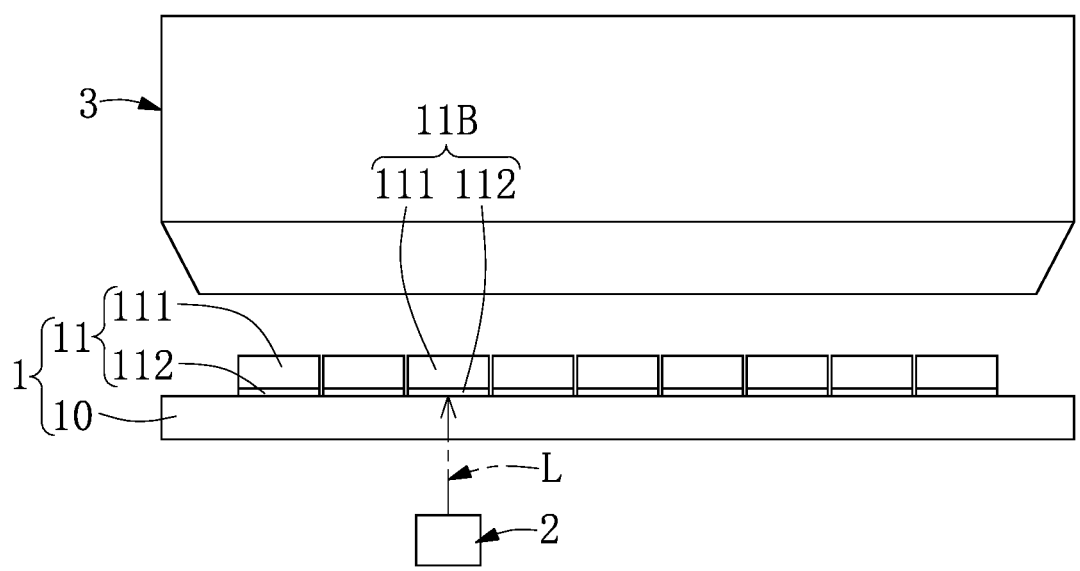
FIG. 3 is a schematic view of a step S102 and step S102 (B) of the method for repairing a semiconductor chip according to the first embodiment of the present disclosure.

Next, as shown in FIG. 1 and FIG. 3, a laser source L generated by a laser generating module 2 is applied to the damaged light-emitting unit 11B to reduce the bonding force between the damaged light-emitting unit 11B and the circuit substrate 10 (step S102). For example, when the laser source L generated by the laser generating module 2 is directed to the damaged light-emitting unit 11B, the bonding force between the damaged light-emitting unit 11B and the circuit substrate 10 is reduced, so that both the damaged light-emitting unit 11B and the circuit substrate 10 are separated from each other.

Figure 4:
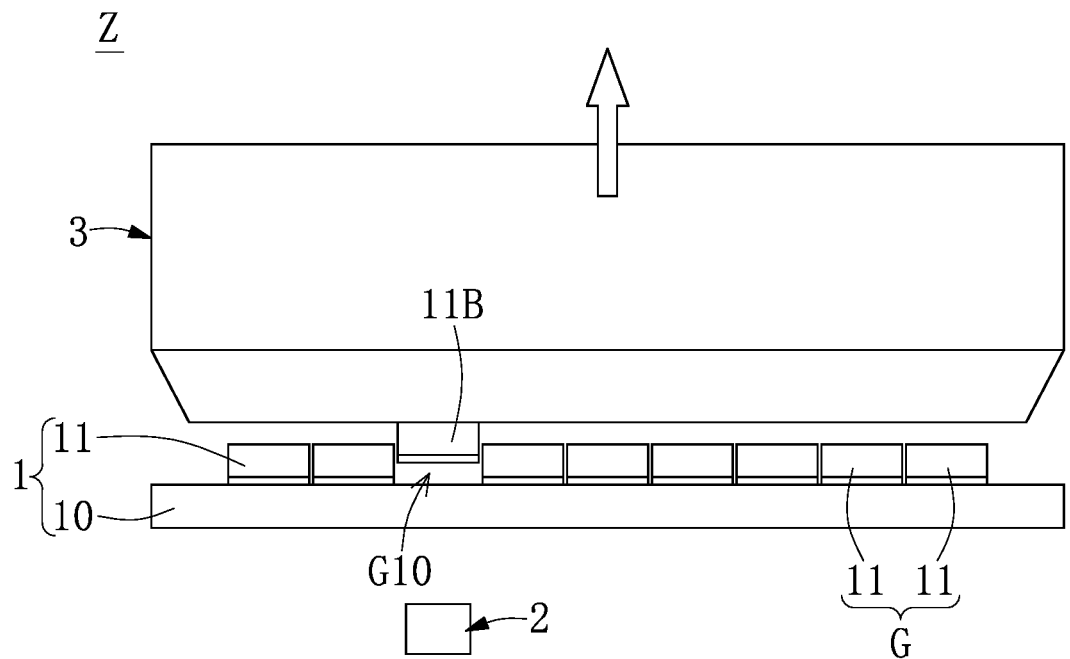
FIG. 4 is a schematic view of a step S104 of the method for repairing a semiconductor chip according to the first embodiment of the present disclosure.

Then, as shown in FIG. 1 and FIG. 4, the damaged light-emitting unit 11B is removed from the circuit substrate 10 by a pick and place module 3 to form an unoccupied position G10 (step S104), or the damaged light-emitting unit 11B is removed from the circuit substrate 10 using the pick and place module 3 so that a light-emitting group G forms an unoccupied position G10. For example, the pick and place module 3 can be a vacuum nozzle or any kind of pick and place machine.

Figure 5:
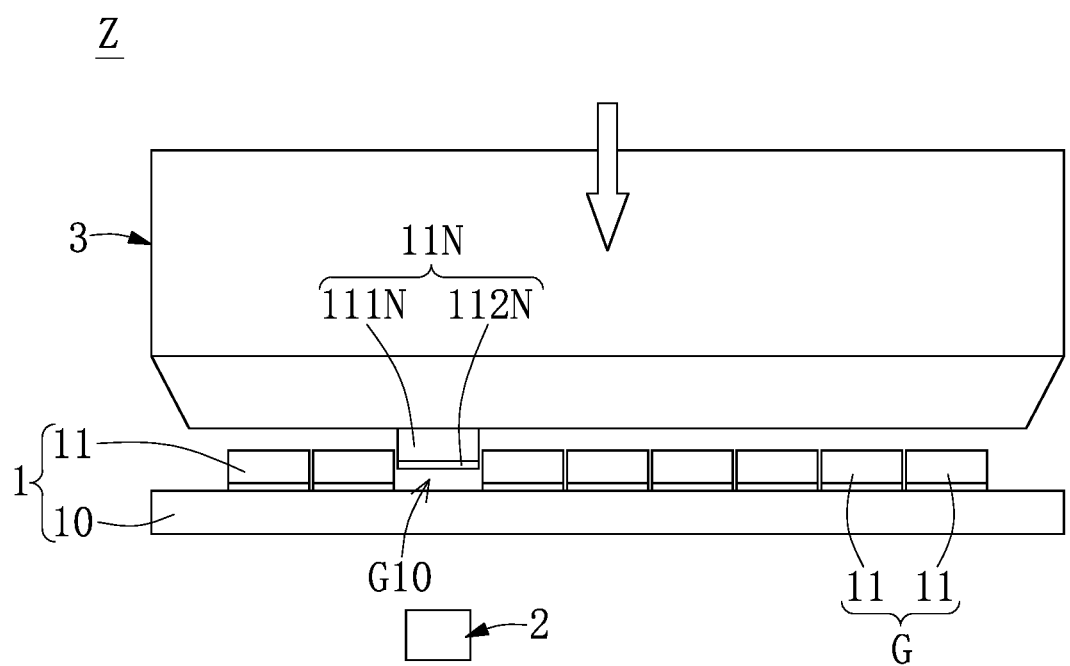
FIG. 5 is a schematic view of a step S106 of the method for repairing a semiconductor chip according to the first embodiment of the present disclosure.

Next, as shown in FIG. 1 and FIG. 5, a good (i.e., intact) light-emitting unit 11N is placed in the unoccupied position G10 by using the pick and place module 3 (step S106), or a good light-emitting unit 11N is placed in the unoccupied position G10 of the light-emitting group G using the pick and place module 3. For example, the good light-emitting unit 11N includes a good LED chip 111N and a new conductive material 112N disposed on the bottom end of the good LED chip 111N, and the new conductive material 112N may be an anisotropic conductive paste or any kind of conductive material.

Figure 6:
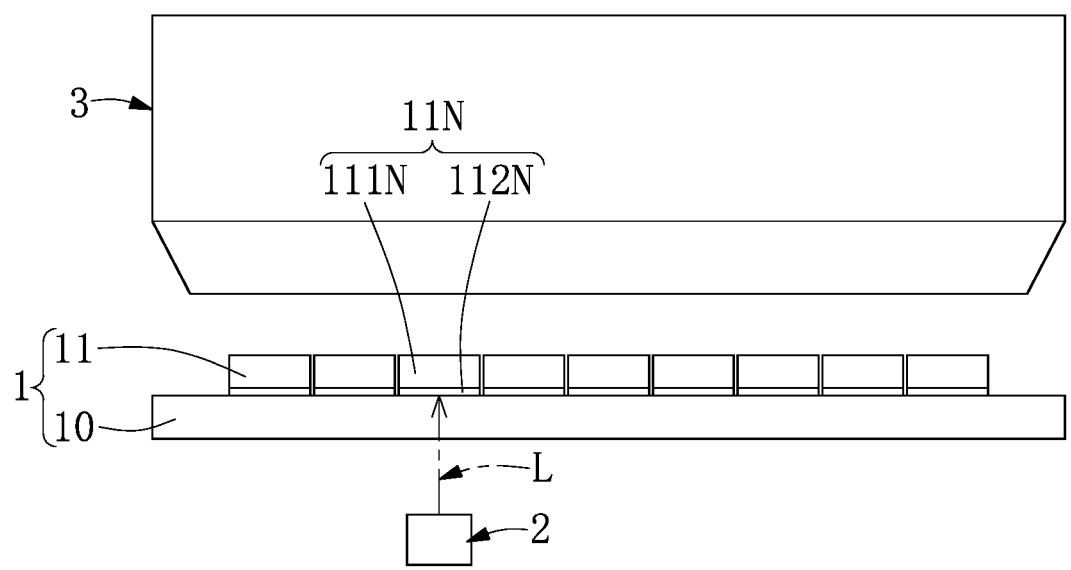
FIG. 6 is a schematic view of a step S108 and step S110 (B) of the method for repairing a semiconductor chip according to the first embodiment of the present disclosure.

Then, as shown in FIG. 1 and FIG. 6, the good light-emitting unit 11N is electrically connected to the circuit substrate 10 (step S108). For example, in the step of the good light-emitting unit 11N being electrically connected to the circuit substrate 10 (step S108), the method further includes: directing the laser source L generated by the laser generating module 2 to the good light-emitting unit 11N, so that the good light-emitting unit 11N is fixed onto the circuit substrate 10 and electrically connected to the circuit substrate 10 (step S110).

Figure 7:
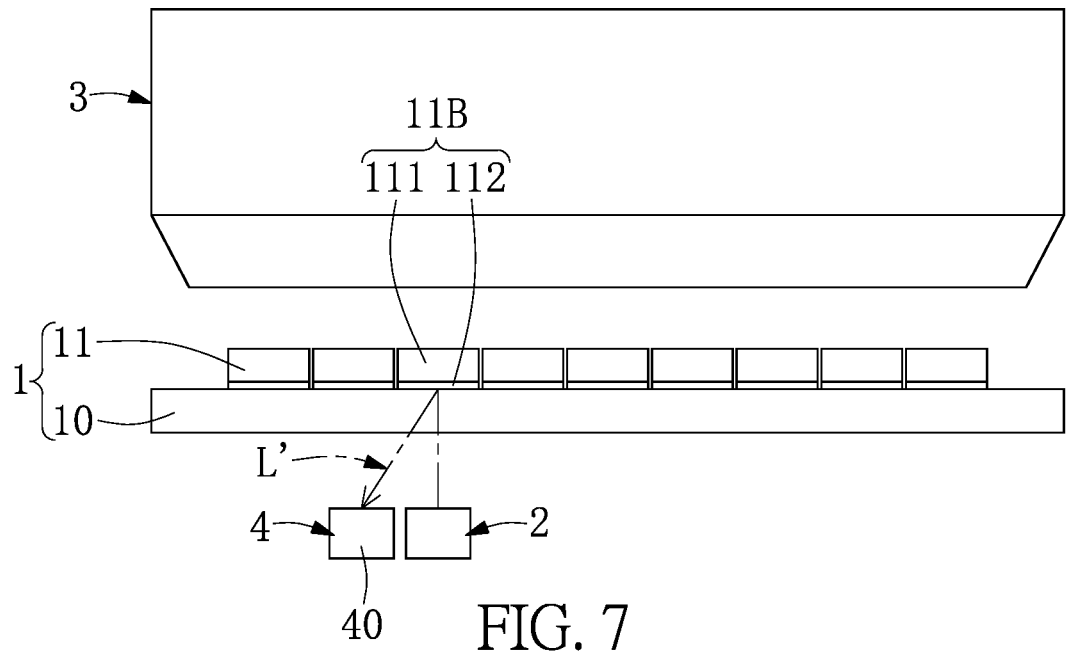
FIG. 7 is a schematic view of a step S102 (A) of the method for repairing a semiconductor chip according to the first embodiment of the present disclosure.

Further, for example, as shown in FIG. 1, FIG. 3 and FIG. 7, in the step of directing the laser source L generated by the laser generating module 2 to the damaged light-emitting unit 11B (step S102), the method further includes: as shown in FIG. 1 and FIG. 7, using a position detecting module 4 to detect a position of a contact interface between the circuit substrate 10 and a conductive material 112 of the damaged light-emitting unit 11B (step S102 (A)); then, as shown in FIG. 1 and FIG. 3, directing the laser source L generated by the laser generating module 2 to the contact interface between the circuit substrate 10 and the conductive material 112 of the damaged light-emitting unit 11B to reduce the bonding force between the circuit substrate 10 and the conductive material 112 of the damaged light-emitting unit 11B (step S102 (B)). For example, as shown in FIG. 7, the position detecting module 4 includes at least one receiving element 40 for receiving a detection wave L', and the detecting wave L' can be provided by the laser generating module 2.

Figure 8:
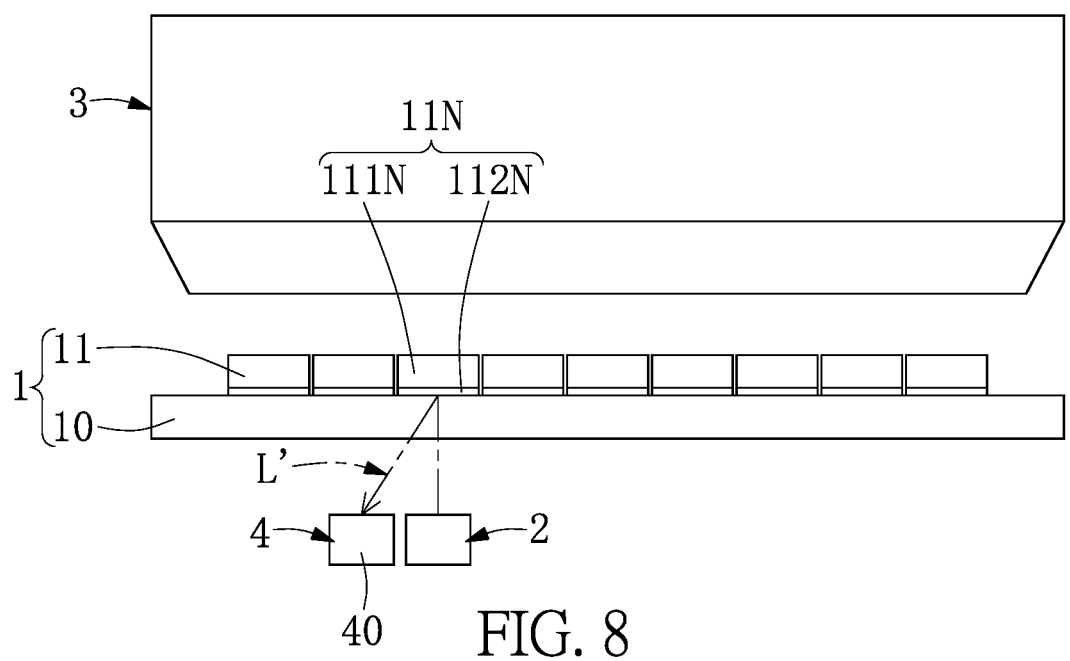
FIG. 8 is a schematic view of a step S110 (A) of the method for repairing a semiconductor chip according to the first embodiment of the present disclosure.

Further, for example, as shown in FIG. 1, FIG. 6, and FIG. 8, in the step of directing the laser source L generated by the laser generating module 2 to the good light-emitting unit 11N (step S110), the method further includes: as shown in FIG. 1 and FIG. 8, using a position detecting module 4 to detect the position of a new conductive material 112N of the good light-emitting unit 11N (step S110 (A)); then, as shown in FIG. 1 and FIG. 6, the laser source L generated by the laser generating module 2 is applied to the new conductive material 112N of the good light-emitting unit 11N to cure the new conductive material 112N (step S110 (B)). For example, as shown in FIG. 8, the position detecting module 4 includes at least one receiving element 40 for receiving a detection wave L', and the detecting wave L' can be provided by the laser generating module 2.

It should be noted that, as shown in FIG. 1 to FIG. 8, the first embodiment of the present disclosure further provides a device for repairing a semiconductor chip Z, and the device for repairing a semiconductor chip Z includes a laser generating module 2 and a pick and place module. 3. For example, device for repairing a semiconductor chip Z can be applied to an LED module 1. The LED module 1 includes a circuit substrate 10 and a plurality of light-emitting units 11 disposed on the circuit substrate 10 and electrically connected to the circuit substrate 10, and at least one plurality of light-emitting units 11 is a damaged light-emitting unit 11B.

Furthermore, as shown in FIG. 3 and FIG. 6, the laser generating module 2 is adjacent to the circuit substrate 10 and disposed under the circuit substrate 10 (which may also be placed above) for generating a laser source L.

For example, as shown in FIG. 3, the laser source L generated by the laser generating module 2 can be directed to the damaged light-emitting unit 11B to reduce the bonding force between the damaged light-emitting unit 11B and the circuit substrate 10. That is, the laser source L generated by the laser generating module 2 can be directed to the contact interface between the circuit substrate 10 and the conductive material 112 of the damaged light-emitting unit 11B to reduce the bonding force between the circuit substrate 10 and the conductive material 112 of the damaged light-emitting unit 11B.

For example, as shown in FIG. 6, the laser source L generated by the laser generating module 2 can be directed to the good light-emitting unit 11N, so that the good light-emitting unit 11N can be fixed onto the circuit substrate 10 and electrically connected to the circuit substrate 10. That is to say, the laser source L generated by the laser generating module 2 can be applied to the new conductive material 112N of the good light-emitting unit 11N to cure the new conductive material 112N, so that the good light-emitting unit 11N can be fixed onto the circuit substrate 10 and electrically connected to the circuit substrate 10. It should be noted that, in the abovementioned embodiment, the wavelengths of the laser source L for bonding the good light-emitting unit 11N to the circuit substrate 10 and the laser source L for reducing the binding force of the damaged light-emitting unit 11B may be the same or may be different from each other.

Furthermore, as shown in FIG. 5 and FIG. 6, the pick and place module 3 is adjacent to the light-emitting unit 11 and disposed above the light-emitting unit 11. For example, the pick and place module 3 can remove the damaged light-emitting unit 11B from the circuit substrate 10 to form an unoccupied position G10 (as shown in FIG. 5), and the pick and place module 3 places a good light-emitting unit 11N into the unoccupied position G10 (as shown in FIG. 6).

Furthermore, as shown in FIG. 7 and FIG. 8, the device for repairing a semiconductor chip Z further includes a position detecting module 4. The position detecting module 4 is adjacent to the circuit substrate 10 and disposed under the circuit substrate 10 for detecting the position of a contact interface between the circuit substrate 10 and a conductive material 112 of the damaged light-emitting unit 11B, or for detecting the position of a new conductive material 112N of the good light-emitting unit 11N.

Second Embodiment

Figure 9:
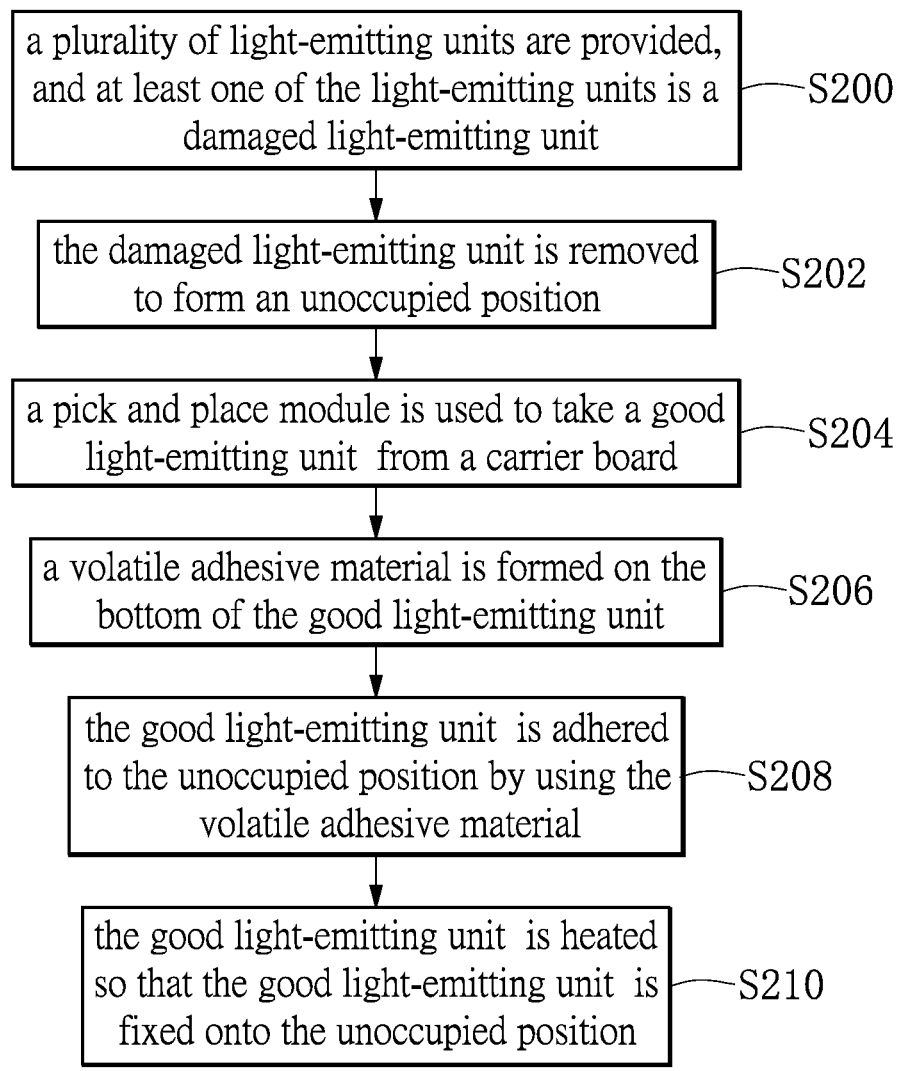
FIG. 9 is a flow chart of a method for repairing a semiconductor chip according to a second embodiment of the present disclosure.

Referring to FIG. 9 to FIG. 17, a second embodiment of the present disclosure provides a method for repairing a semiconductor chip, including the following steps:

First, as shown in FIG. 9 and FIG. 2, a plurality of light-emitting units 11 are provided, and at least one of the light-emitting units is a damaged light-emitting unit 11B (step S200). For example, step S200 of the present embodiment may be similar to step S100 of the first embodiment; that is, an LED module 1 may be provided, and the LED module 1 includes a circuit substrate 10 and a plurality of circuit substrates 10 disposed on the circuit substrate 10 and electrically connected thereto. The light-emitting unit 11 of the circuit substrate 10, and at least one of the light-emitting units 11 is a damaged light-emitting unit 11B. However, the present disclosure is not limited thereto.

Next, as shown in FIG. 9 and FIGS. 3 and 4, the damaged light-emitting unit 11B is removed to form an unoccupied position G10 (step S202). For example, step S202 of the embodiment may be similar to step S102 and step S104 of the first embodiment; that is, a laser source L generated by a laser generating module 2 can be used to direct the damaged light-emitting unit 11B to reduce the bonding force between the damaged light-emitting unit 11B and the circuit substrate 10. Next, using a pick and place module 3 to remove the damaged light-emitting unit 11B from the circuit substrate 10 to form an unoccupied position G10. However, the present disclosure is not limited thereto.

Figure 10:
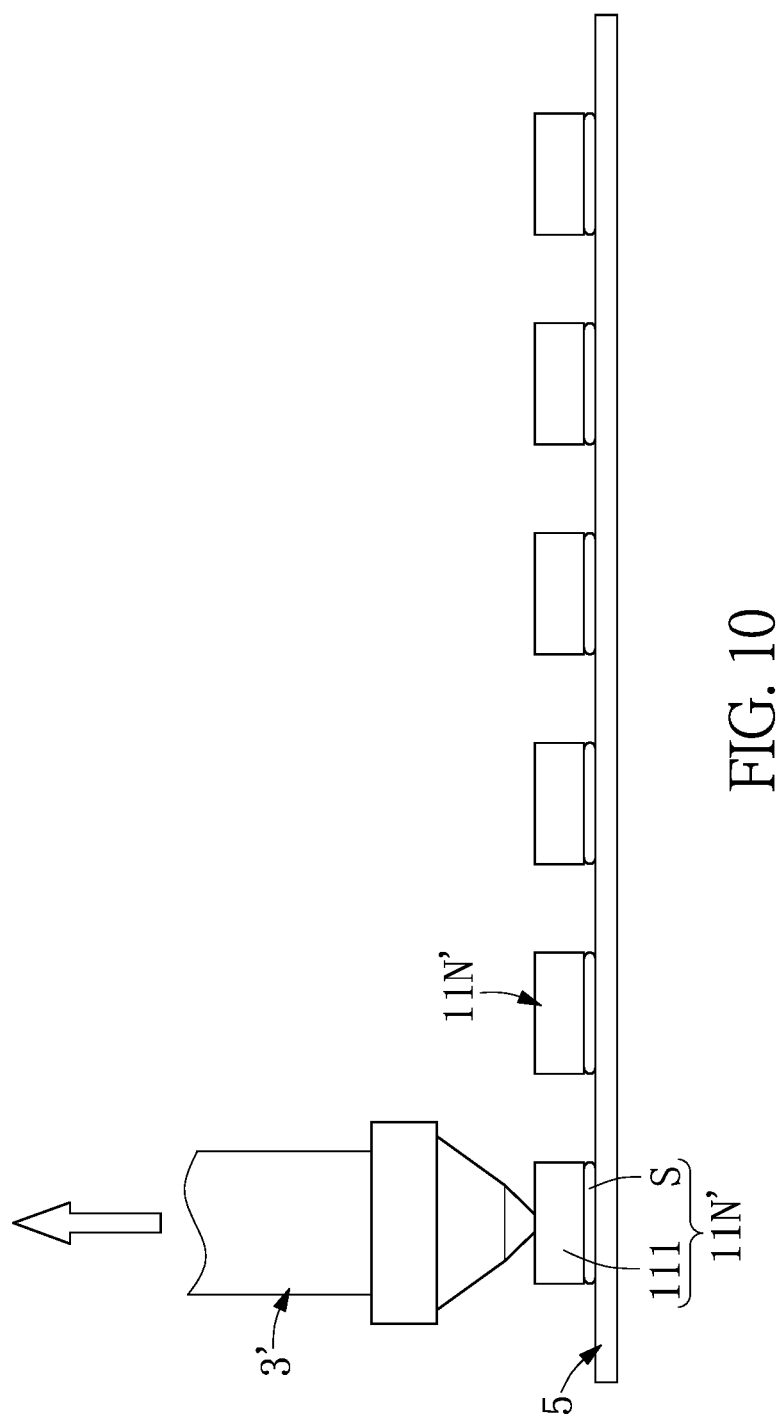
FIG. 10 is a schematic view of a step S204 of the method for repairing a semiconductor chip according to the second embodiment of the present disclosure.

Then, as shown in FIG. 9 and FIG. 10, a pick and place module 3' is used to take a good light-emitting unit 11N' from a carrier board 5 (step S204). For example, the carrier board 5 (for example, a blue film, but not limited thereto) may carry at least one good light-emitting unit 11N', and the good light-emitting unit 11N' includes an LED chip 111 and a conductive joint S on the bottom end of the LED chip 111. The LED chip 111 may be a gallium nitride LED chip (GaN LED), and the conductive joint S may be tin, lead, silver, antimony, copper, iron, gold, platinum, indium, nickel or an alloy including at least two of the foregoing. The good light-emitting unit 11N is obtained by pick and place module 3. The pick and place module 3 can be a vacuum nozzle or any kind of pick and place machine. However, the present disclosure is not limited thereto.

Figure 11:
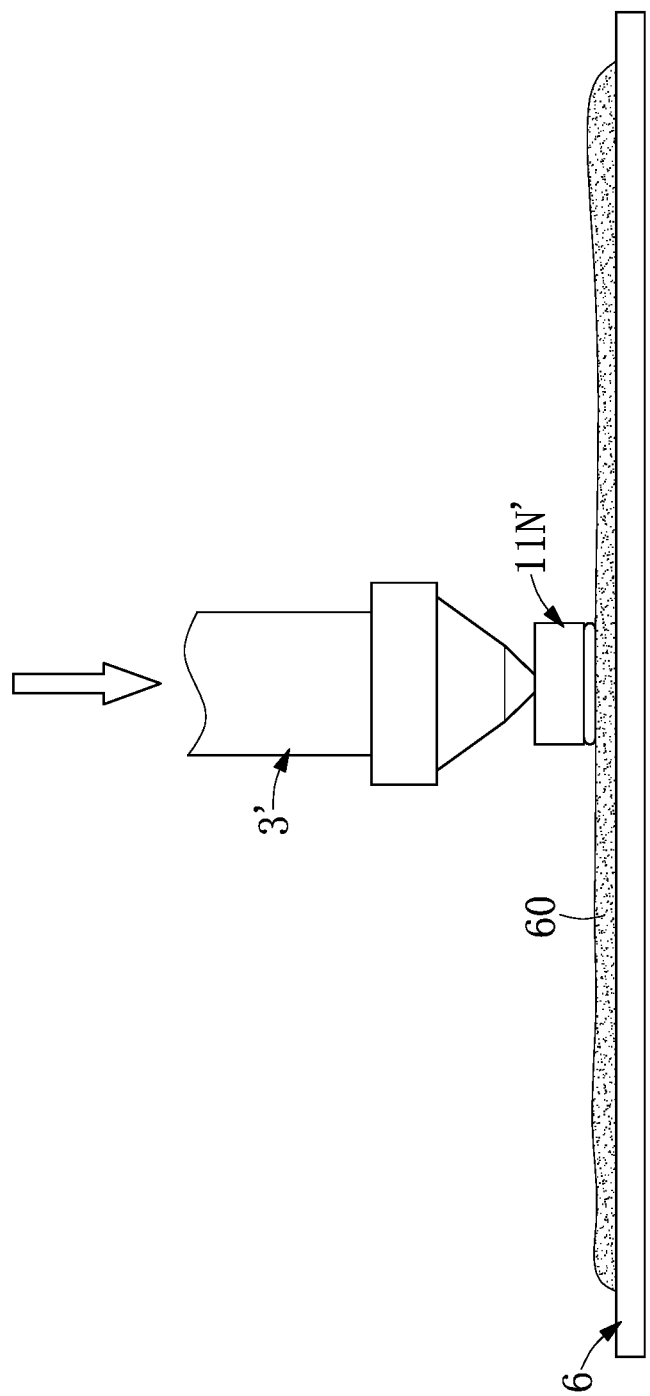
FIG. 11 is a schematic view of a step S206 of the method for repairing a semiconductor chip according to the second embodiment of the present disclosure.

Next, as shown in FIG. 9 and FIG. 11, a volatile adhesive material 60 is formed on the bottom of the good light-emitting unit 11N' (step S206). For example, a volatile adhesive material 60 may be stored through a volatile adhesive material storage module 6 (e.g., a substrate, but not limited thereto), and the volatile adhesive material 60 may a volatile adhesive, a volatile adhesive, a flux, or a volatile adhesion aid or flux with solder, but is not limited thereto. Next, the obtained good light-emitting unit 11N' is brought into contact with the volatile adhesive material 60 on the volatile adhesive material storage module 6 by the pick and place module 3' so that the volatile adhesive material 60 is formed on the bottom of the good light-emitting unit 11N'. However, the present disclosure is not limited thereto.

Figure 12:
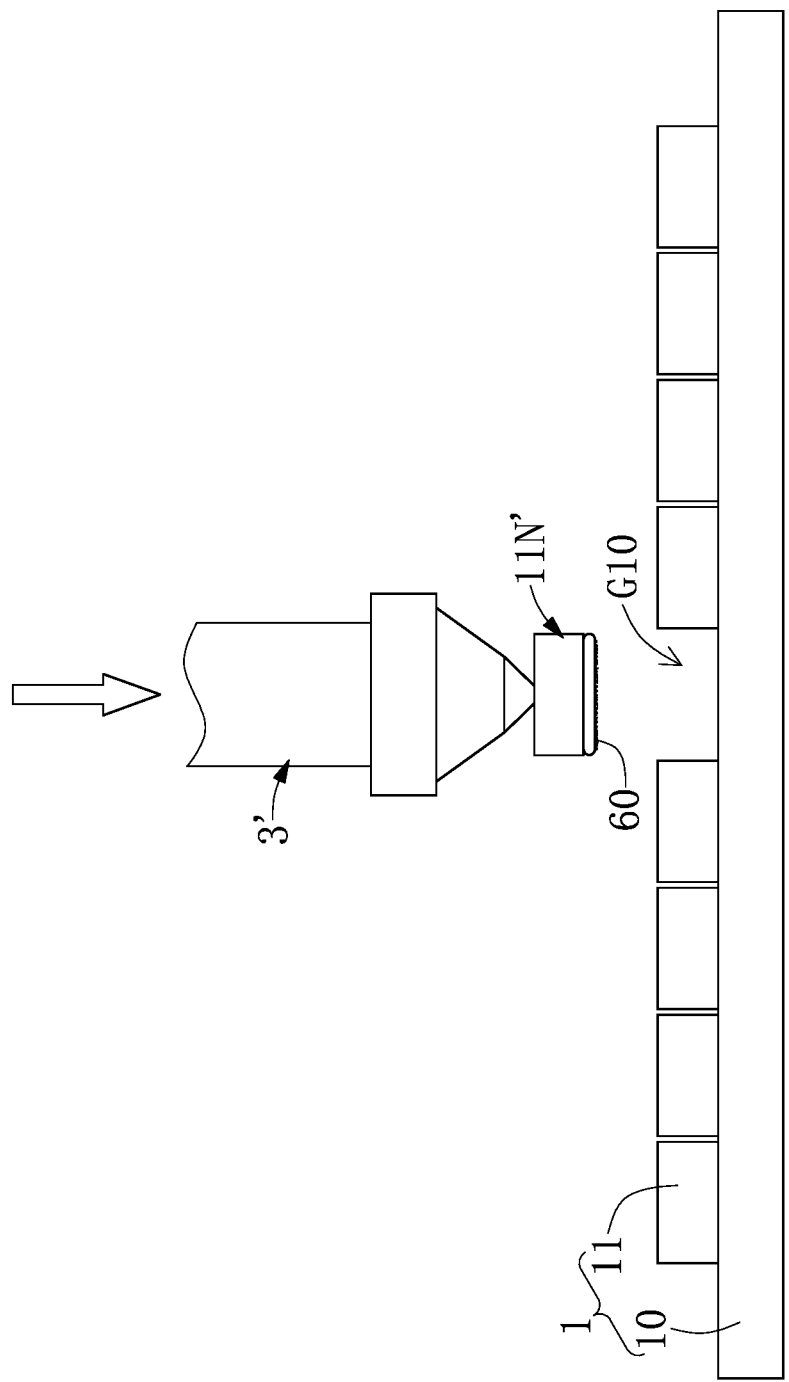
FIG. 12 is a schematic view of a step S208 of the method for repairing a semiconductor chip according to the second embodiment of the present disclosure.

Then, as shown in FIG. 9 and FIG. 12, the good light-emitting unit 11N' is adhered to the unoccupied position G10 by using the volatile adhesive material 60 (step S208). For example, after forming the volatile adhesive material 60 on the bottom of the good light-emitting unit 11N', the good light-emitting unit 11N' is placed on the unoccupied position G10 on the circuit substrate 10 by using the pick and place module 3' so that the good light-emitting unit 11N' is adhered to the unoccupied position G10 by the volatile adhesive material 60. However, the present disclosure is not limited thereto.

Figure 13:
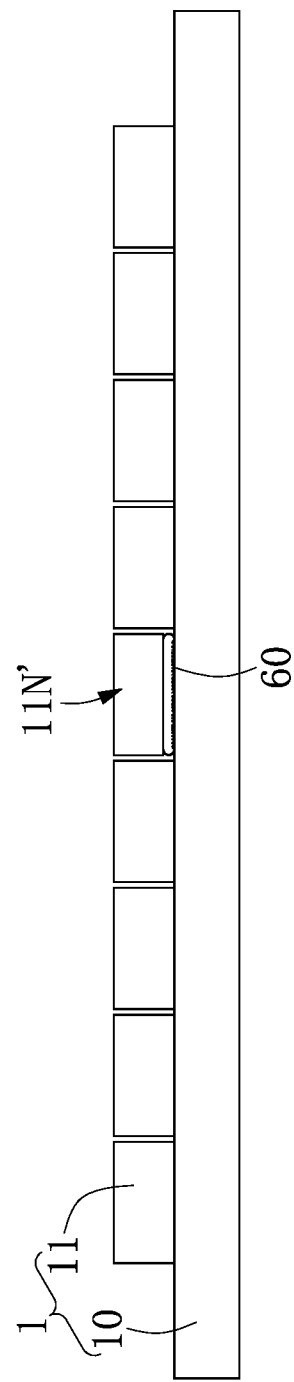
FIG. 13 is a first schematic view of a step S210 of the method for repairing a semiconductor chip according to the second embodiment of the present disclosure.

Finally, as shown in FIG. 9 and FIG. 13, the good light-emitting unit 11N' is heated so that the good light-emitting unit 11N' is fixed onto the unoccupied position G10 (step S210). For example, after the good light-emitting unit 11N is adhered to the unoccupied position G10 of the circuit substrate 10, the good light-emitting unit 11N' may be heated by a tin furnace (not shown) so that the good light-emitting unit 11N' is fixed onto the unoccupied position G10 via a conductive joint S (as shown in FIG. 14) and is electrically connected to the circuit substrate 10 through the conductive joint S.

Figure 14:
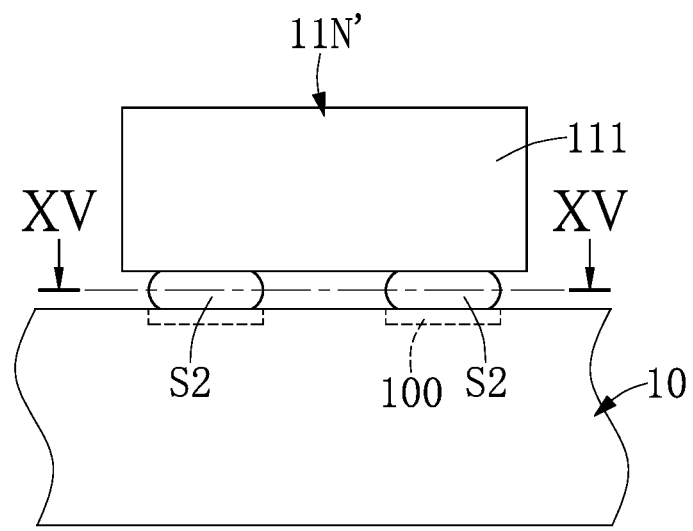
FIG. 14 is a second schematic view of the step S210 of the method for repairing a semiconductor chip according to the second embodiment of the present disclosure.
Figure 15:
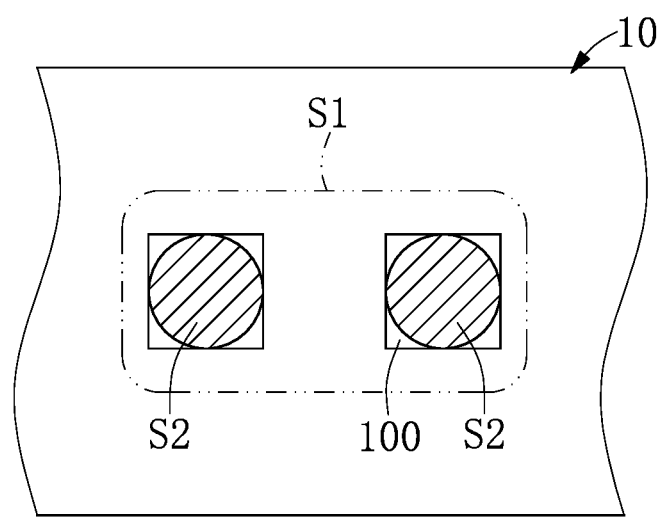
FIG. 15 is a third schematic view of the step S210 of the method for repairing a semiconductor chip according to the second embodiment of the present disclosure.
Figure 16:
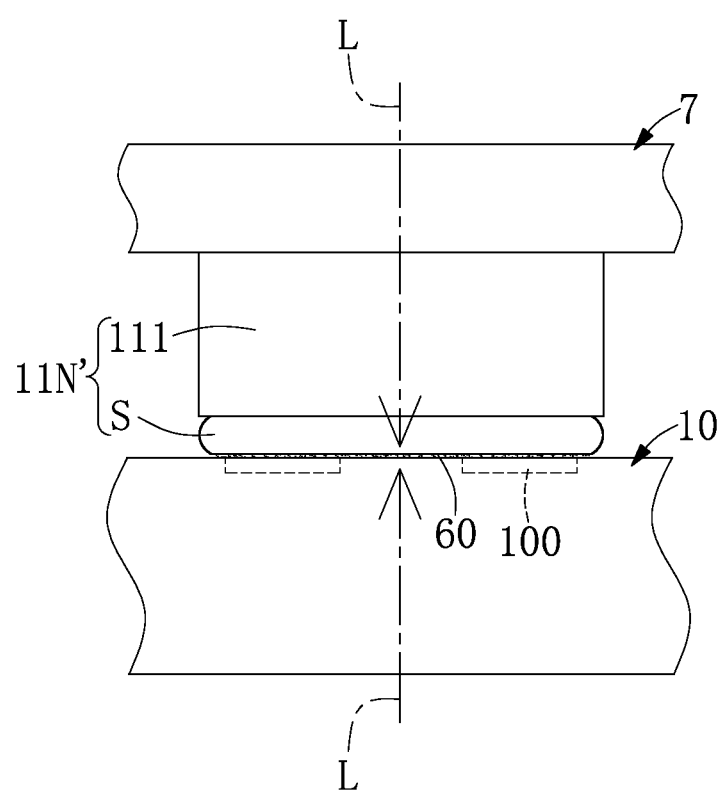
FIG. 16 is a fourth schematic view of the step S210 of the method for repairing a semiconductor chip according to the second embodiment of the present disclosure.
Figure 17:
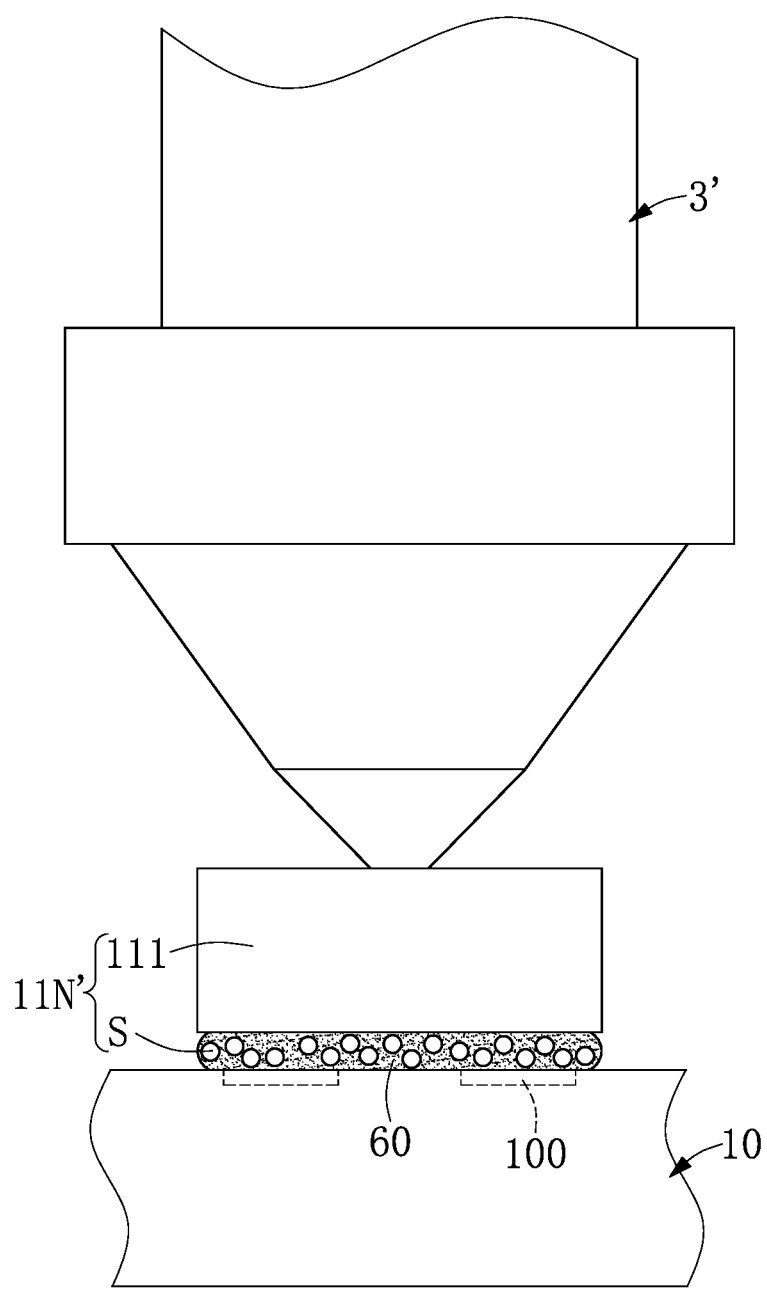
FIG. 17 is another schematic view of the step S206 to the step S208 of the method for repairing a semiconductor chip according to the second embodiment of the present disclosure.

Further, as shown in FIG. 13 to FIG. 15, the circuit substrate 10 has a plurality of pad areas 100 and a non-pad area in which the pad area 100 is not provided. The material of the pad area 100 may be aluminum, gold or other metals and alloys. When the conductive joint S1 on the bottom of the good light-emitting unit 11N' (as shown in FIG. 15) is in a molten state, the conductive joint S above the non-pad area of the circuit substrate 10 moves toward the adjacent pad area 100 due to cohesive force, so that the thickness of the conductive joint S on the non-pad area is gradually thinned. Finally, the conductive joints S above the non-pad area will all move to be above the adjacent pad area 100, so that the non-pad area will be exposed, and the conductive joint S2 above each pad area 100 will form a ball (as shown in FIG. 14). After the conductive joint S2 is cooled and solidified, a solder ball is formed on each of the pad areas 100. It should be noted that the solder balls and different conductive joints can be selected depending on the components to be joined. For example, solder balls can generally be divided into five categories: ordinary solder balls (the atomic percentage of tin is 2% to 100%, the melting point ranges from 180° C. to 316° C.), low-temperature solder balls (including antimony or indium, melting point range, the melting point ranges from 95° C. to 135° C.), high temperature solder balls (melting point ranges from 186° C. to 309° C.), fatigue-resistant high-purity solder balls (melting point ranges from 178° C. to 183° C.) and lead-free solder balls (the atomic percentage of lead in the composition is less than 0.1%). However, the present disclosure is not limited thereto.

It should be noted that, as shown in FIG. 11 and FIG. 7, the second embodiment of the present disclosure further provides a device for repairing a semiconductor chip, which is slightly similar to the device for repairing a semiconductor chip Z of the first embodiment, thus similar component operations will not be described again. Further, the difference between the second embodiment of the present disclosure and the first embodiment is that the device for repairing a semiconductor chip of the present embodiment further includes a volatile adhesive material storage module 6, which can be used for accommodating and storing the volatile adhesive material 60.

Further, in conjunction with FIG. 9 to FIG. 16, step S210 of the second embodiment of the present disclosure further includes abutting the good light-emitting unit 11N' by a pressing board 7. For example, after the good light-emitting unit 11N' is adhered to the unoccupied position G10 of the circuit substrate 10, the good light-emitting unit 11N' can be abutted by the pressing board 7 so that the good light-emitting unit 11N' is firmly in contact with the circuit substrate 10. Next, the laser source L is directed to the conductive joint S of the good light-emitting unit 11N' so that the good light-emitting unit 11N' is fixed onto the unoccupied position G10 (as shown in FIG. 14) and electrically connected to the circuit substrate 10. The laser source L can be generated by the laser generating module 2. However, the present disclosure is not limited thereto.

In addition, as shown in FIG. 9 to FIG. 17, steps S206 to S208 of the second embodiment of the present disclosure further includes forming a volatile adhesive material 60 on the bottom of the good light-emitting unit 11N', and the conductive joint S is mixed with the volatile adhesive material 60. The volatile adhesive material 60 is used to adhere the good light-emitting unit 11N' to the unoccupied position G10. That is, the good light-emitting unit 11N' preloaded by the carrier board 5 may include an LED chip 111, and the volatile adhesive material 60 stored in the volatile adhesive material storage module 6 is mixed with the conductive joint S. Therefore, after the volatile adhesive material 60 including the conductive joint S is formed on the bottom of the good light-emitting unit 11N', the good light-emitting unit 11N' can be fixed onto the unoccupied position G10 through the conductive joint S by the above steps S208 and S210 (as shown in FIG. 14) and electrically connected to the circuit substrate 10 through the conductive joint S. After the conductive joint S is cooled and solidified, solder balls are formed on each of the pad areas 100. However, the present disclosure is not limited thereto.

It should be noted that, in the above-mentioned embodiment, the method for repairing a semiconductor chip and the device for repairing a semiconductor chip can perform positioning and position calculation through an image capturing module (not shown) and a processing module (not shown), so that the pick and place module 3' can precisely remove the damaged light-emitting unit 11B on the circuit substrate 10, obtain the good light-emitting unit 11N' on the carrier board 5, and place the good light-emitting unit 11N' on the unoccupied position G10 on the circuit substrate 10. Naturally, it is also possible to further incorporate the position detecting module 4 or use only the position detecting module 4 for positioning and position calculation.

In conclusion, one of the beneficial effects of the present disclosure is that the method for repairing a semiconductor chip has the technical features of "using a pick and place module 3' to obtain a good light-emitting unit N' from a carrier board 5," "forming a volatile adhesive material 60 on the bottom of the good light-emitting unit N'," "using the volatile adhesive material 60 to adhere the good light-emitting unit N' to the unoccupied position G10" and "heating the good light-emitting unit N', so that the good light-emitting unit N' is fixed onto the unoccupied position G10," so that the damaged light-emitting unit 11B can be replaced by the good light-emitting unit 11N' to achieve the effect of repairing.

Another beneficial effect of the present disclosure is that the method for repairing a semiconductor chip has the technical features of "directing a laser source L generated by a laser generating module 2 to the damaged light-emitting unit 11B to reduce the bonding force between the damaged light-emitting unit 11B and the circuit substrate 10," "placing a good light-emitting unit 11N into the unoccupied space G10 by the pick and place module 3," and "electrically connecting the good light-emitting unit 11N to the circuit substrate 10," so that the damaged light-emitting unit 11B can be replaced by the good light-emitting unit 11N to achieve the effect of repairing.

Still another beneficial effect of the present disclosure is that the device for repairing a semiconductor chip Z has the technical features of "the laser generating module 2 being adjacent to the circuit substrate 10 and disposed under the circuit substrate 10 for generating a laser source L" and "the pick and place module 3 being adjacent to the light-emitting unit 11 and disposed above the light-emitting unit 11," so that the laser source L generated by the laser generating module 2 is directed to the damaged light-emitting unit 11B to reduce the bonding force between the damaged light-emitting unit 11B and the circuit substrate 10, and to remove the damaged light-emitting unit 11B from the circuit substrate 10 by the pick and place module 3 to form an unoccupied space G10. Thereby, since the pick and place module 3 places a good light-emitting unit 11N into the unoccupied space G10, the damaged light-emitting unit 11B can be replaced by the good light-emitting unit 11N to achieve the effect of repairing.

Further, the damaged light-emitting unit 11B on the circuit substrate 10 can be removed and replaced with the good light-emitting unit 11N by using the method for repairing a semiconductor chip and the device for repairing a semiconductor chip provided by the first embodiment and the second embodiment of the present disclosure, thereby achieving the effect of repairing.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for repairing a light-emitting unit, comprising:
    providing a plurality of light-emitting units, and at least one of the plurality of light-emitting units being a damaged light-emitting unit;
    removing the damaged light-emitting unit to form an unoccupied position;
    using a pick and place module to obtain a good light-emitting unit from a carrier board configured to supply the good light emitting unit;
    forming a volatile adhesive material on a bottom of the good light-emitting unit;
    using the volatile adhesive material to adhere the good light-emitting unit to the unoccupied position; and
    heating the good light-emitting unit so that the good light-emitting unit is fixed at the unoccupied position.

2. The method according to claim 1, wherein the good light-emitting unit is electrically connected to a circuit substrate through a conductive joint, and the conductive joint is located under the good light-emitting unit or mixed in the volatile adhesive material.

3. The method according to claim 1, wherein in the heating the good light-emitting unit further comprising abutting the good light-emitting unit to the unoccupied position by a pressing board.

4. A method for repairing a semiconductor chip, comprising:
 providing a plurality of semiconductor chips, and at least one of the plurality of semiconductor chips being a damaged semiconductor chip;
 removing the damaged semiconductor chip to form an unoccupied position;
 using a pick and place module to obtain a good semiconductor chip from a carrier board configured to supply the good semiconductor chip;
 forming a volatile adhesive material on a bottom of the good semiconductor chip;
 using the volatile adhesive material to adhere the good semiconductor chip to the unoccupied position; and
 heating the good semiconductor chip so that the good semiconductor chip is fixed at the unoccupied position.

5. The method according to claim 4, wherein the good semiconductor chip is electrically connected to a circuit substrate through a conductive joint, and the conductive joint is located under the good semiconductor chip or mixed in the volatile adhesive material.

6. The method according to claim 4, wherein in the heating the good semiconductor chip further comprising abutting the good semiconductor chip to the unoccupied position by a pressing board.

7. A method for manufacturing a light-emitting diode (LED) module, comprising:
 providing a plurality of LED chips, and at least one of the plurality of LED chips being a damaged LED chip;
 removing the damaged LED chip to form an unoccupied position;
 using a pick and place module to obtain a good LED chip from a carrier board configured to supply the good LED chip;
 forming a volatile adhesive material on a bottom of the good LED chip;
 using the volatile adhesive material to adhere the good LED chip to the unoccupied position; and
 heating the good LED chip so that the good LED chip is fixed at the unoccupied position.

8. The method according to claim 7, wherein the good LED chip is electrically connected to a circuit substrate through a conductive joint, and the conductive joint is located under the good LED chip or mixed in the volatile adhesive material.

9. The method according to claim 7, wherein in the heating the good LED chip further comprising abutting the good LED chip to the unoccupied position by a pressing board.

* * * * *